(12) United States Patent
Gong et al.

(10) Patent No.: US 8,564,962 B2
(45) Date of Patent: Oct. 22, 2013

(54) ELECTRONIC DEVICE WITH DETACHABLE POWER MODULE

(75) Inventors: Xin-Hu Gong, Shenzhen (CN); Si-Wen Shu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 227 days.

(21) Appl. No.: 13/275,363

(22) Filed: Oct. 18, 2011

(65) Prior Publication Data

US 2012/0300427 A1 Nov. 29, 2012

(30) Foreign Application Priority Data

May 24, 2011 (CN) .......................... 2011 1 0134703

(51) Int. Cl.
H05K 7/00 (2006.01)
(52) U.S. Cl.
USPC .......................................................... 361/728
(58) Field of Classification Search
None
See application file for complete search history.

(56) References Cited

U.S. PATENT DOCUMENTS

| | | | | |
|---|---|---|---|---|
| 4,680,676 A | * | 7/1987 | Petratos et al. | 361/818 |
| 5,124,888 A | * | 6/1992 | Suzuki et al. | 361/740 |
| 5,740,001 A | * | 4/1998 | Flachslaender et al. | 361/93.1 |
| 5,822,189 A | * | 10/1998 | Isshiki | 361/736 |
| 5,905,622 A | * | 5/1999 | Finlay et al. | 361/118 |
| 6,313,986 B1 | * | 11/2001 | Jang | 361/679.41 |
| 6,372,989 B1 | * | 4/2002 | Rischard et al. | 174/70 B |
| 6,461,176 B1 | * | 10/2002 | Haas | 439/133 |
| 6,483,711 B1 | * | 11/2002 | Huang | 361/736 |
| 7,184,258 B2 | * | 2/2007 | Lai | 361/641 |
| 7,470,861 B1 | * | 12/2008 | Ross et al. | 174/95 |
| 7,614,672 B2 | * | 11/2009 | Smith et al. | 292/336.3 |
| 7,667,983 B2 | * | 2/2010 | Wang | 361/807 |
| 7,710,730 B2 | * | 5/2010 | Chen | 361/721 |
| 7,742,303 B2 | * | 6/2010 | Azuma et al. | 361/699 |
| 8,248,808 B2 | * | 8/2012 | Wei et al. | 361/749 |
| 2005/0068735 A1 | * | 3/2005 | Fissore et al. | 361/702 |
| 2005/0190539 A1 | * | 9/2005 | Watanabe et al. | 361/704 |
| 2007/0140626 A1 | * | 6/2007 | Chan | 385/89 |
| 2008/0124970 A1 | * | 5/2008 | Yasuda et al. | 439/527 |
| 2008/0158788 A1 | * | 7/2008 | Darr et al. | 361/647 |
| 2008/0294324 A1 | * | 11/2008 | Yoshinari et al. | 701/102 |
| 2009/0057006 A1 | * | 3/2009 | Kishibata et al. | 174/521 |
| 2009/0161332 A1 | * | 6/2009 | Chien | 361/811 |
| 2010/0097765 A1 | * | 4/2010 | Suzuki et al. | 361/699 |
| 2010/0110643 A1 | * | 5/2010 | Lin | 361/728 |
| 2010/0165588 A1 | * | 7/2010 | Chan et al. | 361/756 |
| 2012/0020030 A1 | * | 1/2012 | Merlet et al. | 361/735 |
| 2012/0243190 A1 | * | 9/2012 | Correll et al. | 361/756 |
| 2012/0281374 A1 | * | 11/2012 | Lee et al. | 361/756 |

* cited by examiner

*Primary Examiner* — Jinhee Lee
*Assistant Examiner* — Xanthia C Cunningham
(74) *Attorney, Agent, or Firm* — Altis & Wispro Law Group, Inc.

(57) ABSTRACT

An electronic device includes a casing with a side plate and encasing a power module. The power module includes a locking member, a sliding member, and an elastic member sandwiched between the base and the cover. The sliding member is movable relative to the locking member between a locked position in which the locking portion of the locking member is pushed by the elastic member to extend through the cover to be blocked by the side plate of the casing, and an unlocked position in which the locking member is pressed by the sliding member to withdraw from the side plate to allow removal of the power module from the casing.

14 Claims, 8 Drawing Sheets

ELECTRONIC DEVICE WITH DETACHABLE POWER MODULE

CROSS-REFERENCE TO RELATED APPLICATION

This patent application is related to a patent application Ser. No. 13/241,287, filed on Sep. 23, 2011, entitled "ELECTRONIC DEVICE WITH EASILY DETACHABLE POWER MODULE", assigned to the same assignee, and disclosure of which is incorporated herein by reference in its entirety.

BACKGROUND

1. Technical Field

The disclosure relates to electronic devices, and particularly to an electronic device with an easily detachable power module.

2. Description of the Related Art

An electronic device, such as a desktop computer, tower computer, server, or the like, usually includes power modules for connecting to a power supply. The installation of the power module in a computer typically involves the use of screws. However, assembly and detachment of the power module require a tool, such as a screwdriver, rendering the processes cumbersome and time-consuming.

What is needed, therefore, is an electronic device which can overcome the limitations described.

DETAILED DESCRIPTION

Figure 1:
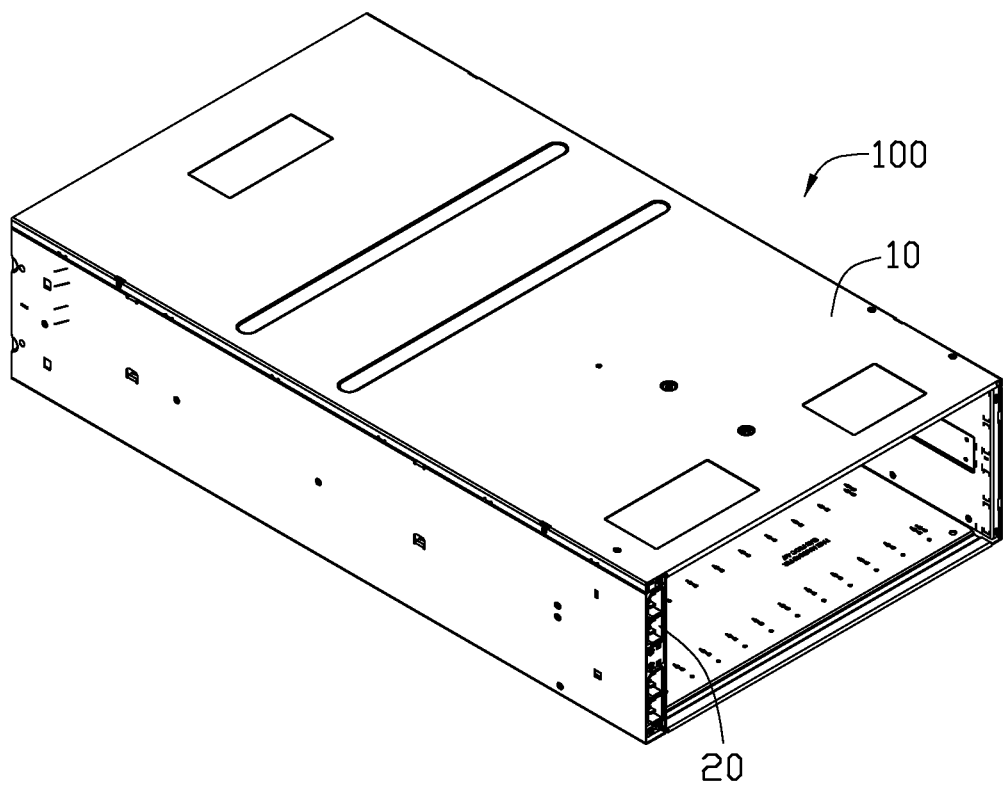
FIG. 1 is an isometric view of an assembled electronic device in accordance with an exemplary embodiment.

Reference will be made to the drawing figures to describe the present electronic device in detail.

Referring to FIG. 1, an electronic device 100 in accordance with an exemplary embodiment includes a casing 10 and a power module 20 in the casing 10. The electronic device 100 can be, for example, a server or a computer.

Figure 2:
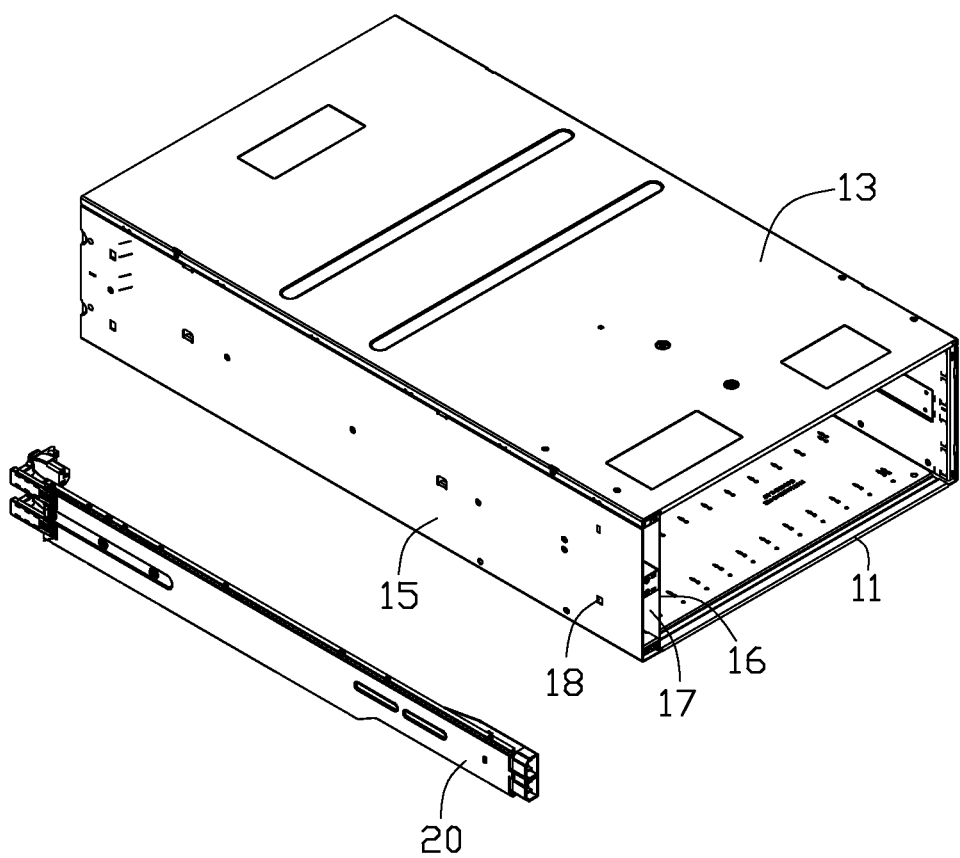
FIG. 2 is an exploded view of a power module and a casing of the electronic device of FIG. 1.

Referring to FIG. 2, the casing 10 includes a bottom plate 11, a top plate 13 and two side plates 15, 16 connecting the bottom plate 11 to the top plate 13. A receiving room 17 is defined between the side plates 15, 16. The side plate 15 defines a fixing hole 18 communicating with the receiving room 17. The power module 20 is received in the receiving room 17.

Figure 3:
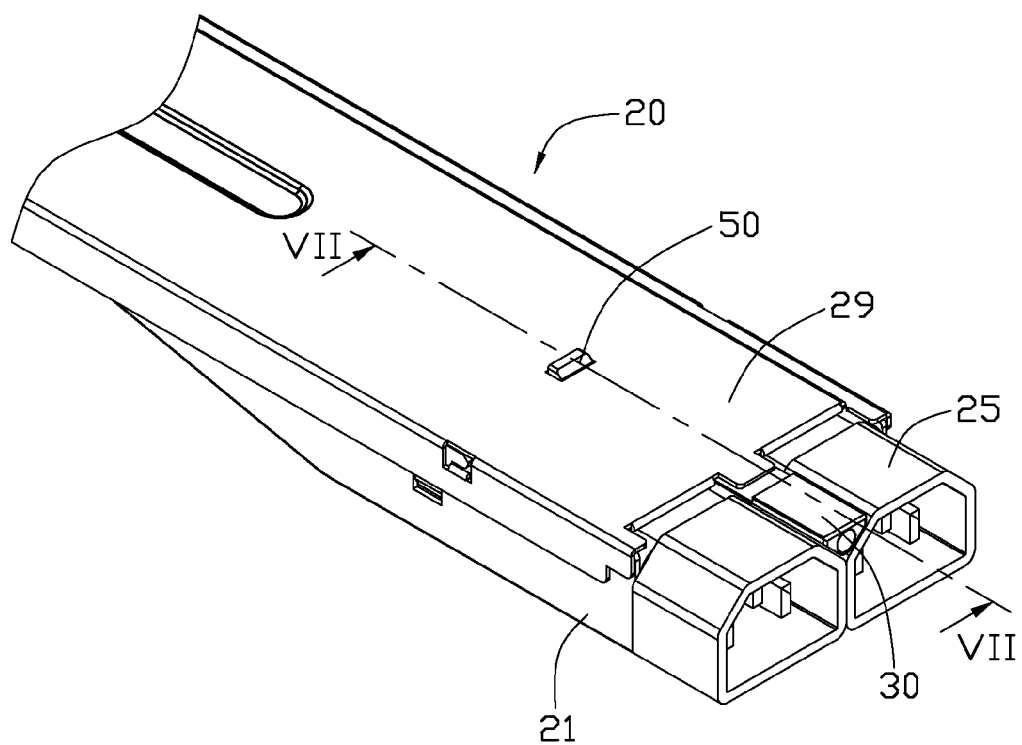
FIG. 3 is a view of part of the assembled power module of FIG. 2, shown from a different aspect.
Figure 4:
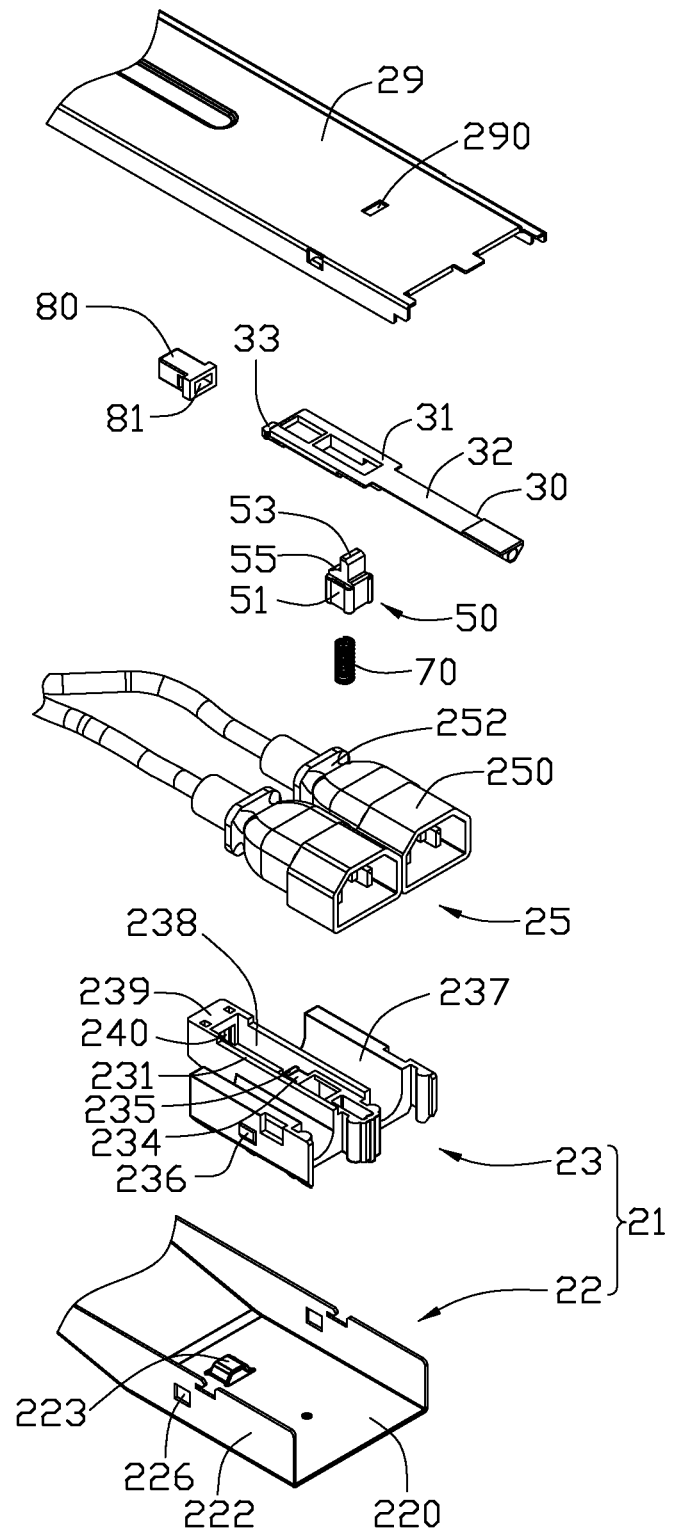
FIG. 4 is an exploded view of the power module of FIG. 3.
Figure 5:
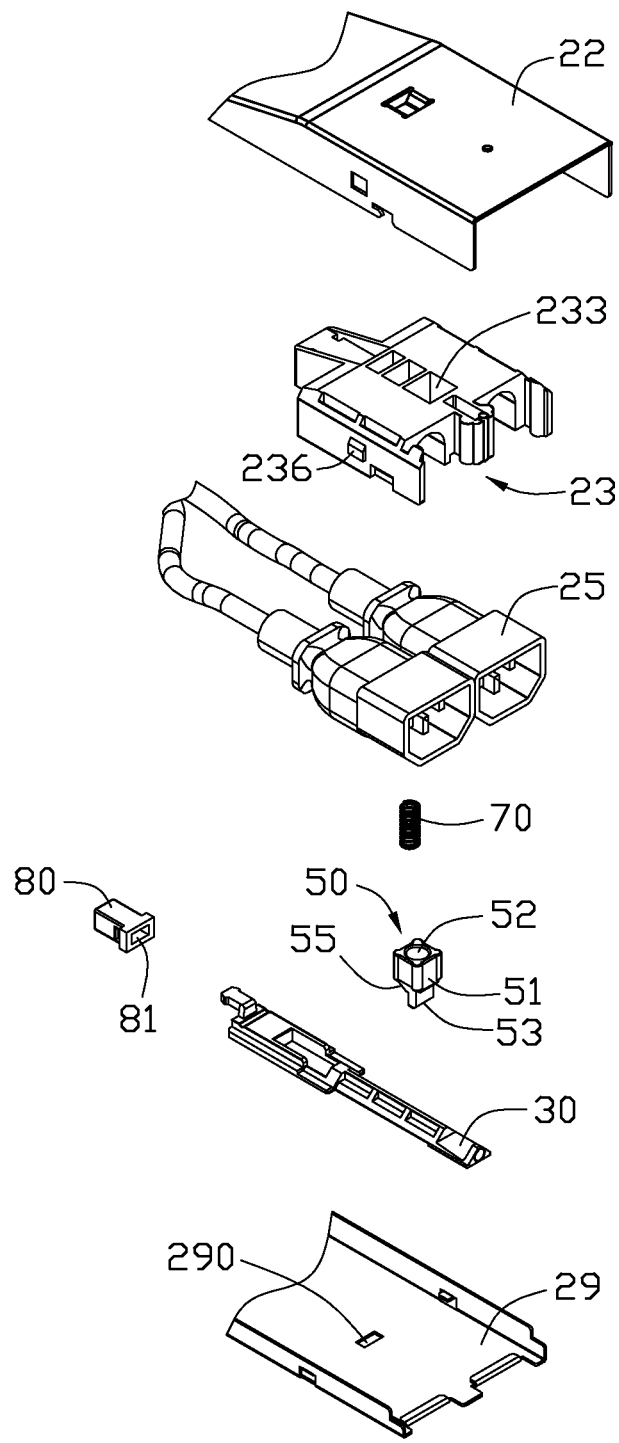
FIG. 5 is an inverted view of the power module of FIG. 4.

Referring to FIGS. 3-5, the power module 20 includes a base 21, a cover 29, two power connectors 25, a sliding member 30, and a locking member 50 with an elastic member 70 therein. In this embodiment, the elastic member 70 is a pressing spring. The cover 29 attaches to the base 21 so as to sandwich the connector 25, the sliding member 30 and the locking member 50.

The cover 29 defines a through hole 290 therein. The base 21 includes a bracket 22 and a securing member 23 received in the bracket 22. The bracket 22 includes a bottom wall 220 and two lateral walls 222 extending upwards from the two opposite sides of the bottom wall 220. The bottom wall 220 has a protrusion 223 extending up from a central portion thereof. Each of the lateral walls 222 defines a through hole 226 therein.

The securing member 23 is received in the bracket member 22 and defines a fixing hole 233 in the bottom surface thereof to receive the protrusion 223. Two blocking portions 236 extend outwards from the two sides of the securing member 23 into the through holes 226 of the bracket member 22. Thereby, the securing member 23 may be secured in the bracket member 22. The securing member 23 defines a rectangular receiving groove 238 thereon and two U-shaped receiving grooves 237 flanking the receiving groove 238. Two middle walls 231 extend respectively from a top surface of the securing member 23 on either side of the receiving groove 238. The middle walls 231 are parallel. A connecting wall 239 connects the rear ends of the middle walls 231. The connecting wall 239 defines a locating hole 240 communicating with the receiving groove 238. A fixing member 80 is mounted in the locating hole 240, an opening 81 is defined in an end of the fixing member 80, facing the receiving groove 238. An elastic portion 234 extends from the securing member 23 in the receiving groove 238 and away from the locating hole 240. A latching portion 235 extends upwards from a free end of the elastic portion 234.

The connectors 25 are received in the receiving grooves 237. Each of the connectors 25 includes a head portion 250 and an end portion 252. The end portions 252 are received in the receiving grooves 237 of the securing member 23. The head portions 250 are mounted beyond the front edge of the securing member 23. The sliding member 30 is movably engaged between the power connectors 25.

Figure 6:
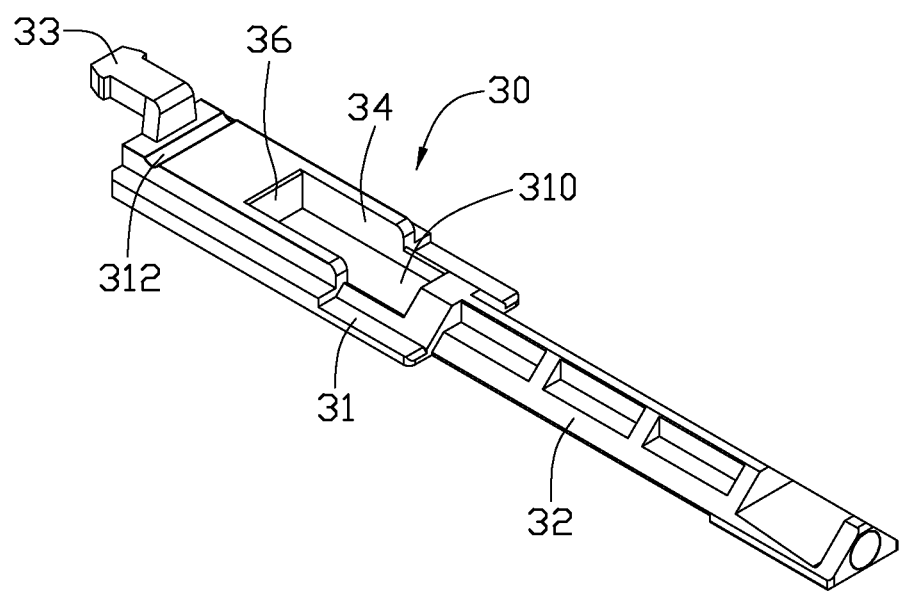
FIG. 6 is a view of a sliding member of the power module of FIG. 5.

Referring to FIG. 6, the sliding member 30 includes a rectangular body 31, an operating portion 32 and an inserting portion 33. The operating portion 32 extends lengthways from an end of the body 31, and the inserting portion 33 extends from the other end of the body 31 opposite to the operating portion 32. The body 31 defines a lengthways slot 310 through the top and bottom thereof. The body 31 in the slot 310 has two parallel sidewalls 34 and a contact end 36 away from the operating portion 32. The body 31 defines a concave portion 312 at the bottom surface near the inserting portion 33. In this embodiment, the concave portion 312 is a transverse slit defined at a bottom surface of the body 31.

The locking member 50 is movably received in the receiving groove 238 of the securing member 23. The locking member 50 includes a main body 51 and a locking portion 53 extending upwards from the main body 51. The main body 51 is quadrate and defines a blind hole 52 at a bottom surface thereof to receive the elastic member 70. The main body 51 has an inclined contact surface 55 at a top, rear end thereof. The contact surface 55 inclines downwards and outwards to face the contact end 36 of the sliding member 30.

Figure 8:
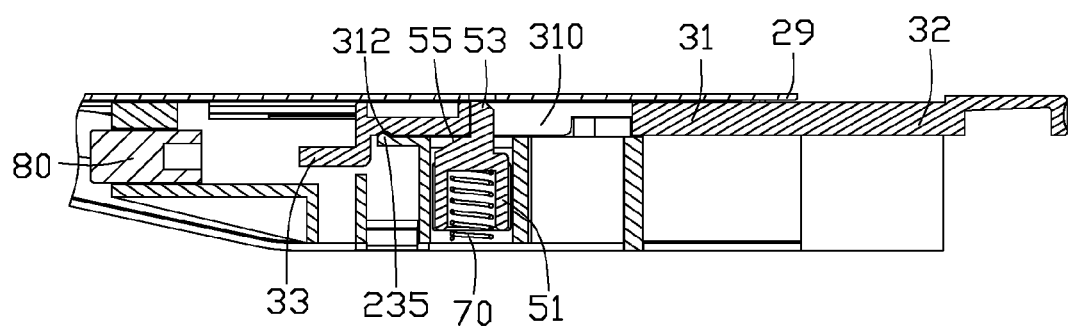
FIG. 8 is similar to FIG. 7, but showing the locking member in an unlocked position.

Referring also to FIG. 8, in assembling the power module 20, the securing member 23 is received in the bracket 22. The end portions 252 of the connectors 25 are received in the receiving grooves 237 of the securing member 23. The operating portion 32 of the sliding member 30 is mounted between the head portions 250 of the connectors 25. The body 31 is mounted on the securing member 23. The middle walls 231 are each received between the side plates 36 and the sidewalls 34 of the sliding member 30. The sliding member 30 can accordingly slide along the middle walls 231. The inserting portion 33 is movably received in the opening 81 of the fixing member 80. In this embodiment, the fixing member 80 can be a locating device with a blocking portion (not shown) and a spring (not shown) therein. When the inserting portion 33 is initially pushed towards the fixing member 80, the inserting portion 33 is received in the opening 81 and retained by the blocking portion of the fixing member 80; when the inserting portion 33 is pushed again towards the fixing member 80 at a second time, the inserting portion 33 is disengaged from the blocking portion and pushed by the spring of the fixing member 80 and separated away from the fixing member 80. The elastic member 70 is received in the blind hole 52 of the main body 51 of the locking member 50 and sandwiched between the securing member 23 and the locking member 50. The locking portion 53 extends through the slot 310 of the sliding member 30 and near the operating portion 32. When the cover 29 is fastened on the base 21, the locking portion 53 extends through the through hole 290 by an upper elastic force by the elastic member 70.

Figure 7:
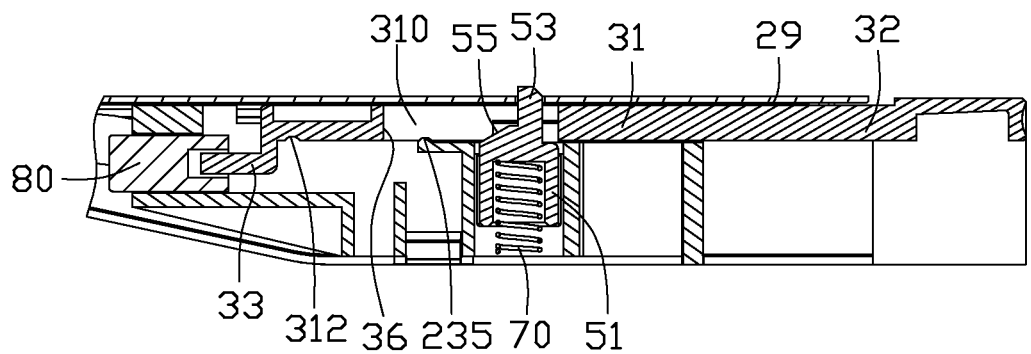
FIG. 7 is a cross-sectional view of the power module of FIG. 3, taken along a line XI-XI thereof, and showing the locking member of the power module in a locked position.

Referring also to FIG. 7, in a first (closed) state of the power module 20, the locking member 50 is in a locked position when the front end of the sliding member 30 is coplanar with the front ends of the head portions 250 of the connectors 25. In the first state, the elastic member 70 pushes the locking member 50 upwards from a bottom of the securing member 23 and to cause the locking portion 53 to protrude upwards through the through hole 290 and beyond a top surface of the cover 29. When the power module 20 needs to be unlocked (a second state), the operating portion 32 is pushed inwards to make the inserting portion 33 slide towards the fixing member 80. The inserting portion 33 is pushed back by the fixing member 80 and separated away from the fixing member 80. The sliding member 30 slides to the front ends of the head portions 250. The sliding member 30 is then pulled outwards to bring the contact end 36 to the contact surface 55 and press down the contact surface 55. The locking portion 53 follows the main body 51 down and is disengaged from the through hole 290 of the cover 29. Simultaneously, the latching portion 235 of the securing member 23 is elastically engaged in the concave portion 312 of the sliding member 30. Thus, the locking member 50 is unlocked, as shown in FIG. 8.

Referring again to FIGS. 1-3, in use, the power module 20 is received in the receiving room 17 of the casing 10 in the first (closed) state. The locking portion 53 of the locking member 50 protrude beyond the cover 29 and are locked in the fixing hole 18 of the side plates 15 to secure the power module 20 in the casing 10. In disassembly, the power module 20 is turned in the second state with the locking member 50 unlocked by operating the sliding member 30. The locking portion 53 is disengaged from the fixing hole 18 of the side plates 15; thus, the power module 20 can be withdrawn from the casing 10. Without using any tools, the power module 20 can be fixed to and disassembled from the electronic device 100.

As described above, when a user or operator uses finger pressure to operate the sliding member 30, the power module 20 can be driven to slide from the casing 10. Therefore, the attachment and detachment of the power module 20 for this electronic device is very user-friendly.

It is to be further understood that even though numerous characteristics and advantages have been set forth in the foregoing description of the embodiment(s), together with details of the structures and functions of the embodiment(s), the disclosure is illustrative only; and that changes may be made in detail, especially in the matters of shape, size, and arrangement of parts within the principles of the disclosure to the full extent indicated by the broad general meaning of the terms in which the appended claims are expressed.

What is claimed is:

1. An electronic device, comprising:
   a casing comprising a side plate; and
   a power module attached to the side plate of the casing, the power module comprising:
   a base;
   a cover engaged with the base;
   a connector mounted between the base and the cover;
   a sliding member sandwiched between the base and the cover and defining a through slot;
   a locking member comprising a main body movably received in the base, and a locking portion connecting the main body and extending through the slot of the sliding member; and
   an elastic member sandwiched between the main body of the locking member and the base;
   wherein the sliding member is movable relative to the locking member between a locked position in which the locking portion of the locking member is pushed by the elastic member to extend through the cover to be blocked by the side plate of the casing, and an unlocked position in which the locking member is pressed by the sliding member to withdraw from the side plate to allow removal of the power module from the casing.

2. The electronic device of claim 1, wherein the main body of the locking member has an inclined contact surface, the sliding member comprising a contact end in the slot to press the contact surface of the locking member away from the cover in the unlocked position.

3. The electronic device of claim 1, wherein the sliding member comprises a body, an operating portion connecting one end of the body, and an inserting portion connecting the other end of the body and opposite to the operating portion, the slot being defined through the body.

4. The electronic device of claim 3, wherein the base comprises a fixing member retaining the inserting portion when the inserting portion is pushed towards the fixing member at a first time, and pushing the inserting portion to separate away from the fixing member when the inserting portion is pushed towards the fixing member at a second time.

5. The electronic device of claim 1, wherein the sliding member has a concave portion and the base comprises a latching portion elastically engaged in the concave portion when the sliding member is in the unlocked position.

6. The electronic device of claim 1, wherein the slot of the sliding member extends lengthways and the concave portion of the sliding member extends transversely.

7. The electronic device of claim 1, wherein the main body of the locking member defines a blind hole at a bottom thereof to receive the elastic member.

8. The electronic device of claim 7, wherein the elastic member is a spring.

9. An electronic device, comprising:
   a casing; and
   a power module received in the casing, the power module comprising:
   a base;
   a cover engaged with the base;
   at least a connector mounted between the base and the cover;
   a sliding member sandwiched between the base and the cover;

a locking member movably received in the base, the locking member comprising a locking portion extending through the sliding member; and an elastic member sandwiched and pressed between the locking member and the base, the elastic member pushing the locking member to space apart from the base;

wherein the sliding member is movable relative to the locking member between a locked position in which the locking portion of the locking member is pushed by the elastic member to extend through the cover to be blocked by the side plate of the casing, and an unlocked position in which the locking member is pressed by the sliding member to withdraw from the side plate to allow removal of the power module from the casing.

10. The electronic device of claim 9, wherein the locking member has an inclined contact surface, the sliding member comprising a contact end to press the contact surface of the locking member away from the cover in the unlocked position.

11. The electronic device of claim 9, wherein the sliding member comprises a body, an operating portion connecting one end of the body, and an inserting portion connecting the other end of the body and opposite to the operating portion.

12. The electronic device of claim 11, wherein the base comprises a fixing member retaining the inserting portion when the inserting portion is pushed towards the fixing member at a first time, and pushing the inserting portion to separate away from the fixing member when the inserting portion is pushed towards the fixing member at a second time.

13. The electronic device of claim 9, wherein the sliding member has a concave portion and the base comprises a latching portion elastically engaged in the concave portion when the sliding member is in the unlocked position.

14. The electronic device of claim 9, wherein the locking member defines a blind hole at a bottom thereof to receive the elastic member.

\* \* \* \* \*